United States Patent [19]

Chen et al.

[11] Patent Number: 5,607,873
[45] Date of Patent: Mar. 4, 1997

[54] METHOD FOR FORMING CONTACT OPENINGS IN A MULTI-LAYER STRUCTURE THAT REDUCES OVERETCHING OF THE TOP CONDUCTIVE STRUCTURE

[75] Inventors: Hung-Sheng Chen, San Jose; Tim Nguyen, Milpitas; Larry Moberly, Santa Clara; Chih S. Teng, San Jose, all of Calif.

[73] Assignee: National Semiconductor Corporation, Santa Clara, Calif.

[21] Appl. No.: 637,072

[22] Filed: Apr. 24, 1996

[51] Int. Cl.⁶ .................................................. H01L 21/768
[52] U.S. Cl. ............................ 437/51; 437/195; 437/978
[58] Field of Search ........................... 437/51, 192, 193, 437/194, 195, 978

[56] References Cited

U.S. PATENT DOCUMENTS

| | | | |
|---|---|---|---|
| 5,109,267 | 4/1992 | Koblinger et al. | 437/978 |
| 5,254,497 | 10/1993 | Liu | 437/978 |
| 5,399,533 | 3/1995 | Pramanik et al. | 437/195 |
| 5,459,100 | 10/1995 | Choi | 437/195 |

OTHER PUBLICATIONS

Cacharelis, P. et al., "A 1.0 um BiCMOS with EEPROM Technology for Application in the Design of Smart Analog and Mixed-Signal ASIC Products," *IEEE 1992 Custom Integrated Circuits Conference*, pp. (9.7.1)–(9.7.4).

Martinez, M., "A year later, CMP market has grown even hotter," Market Watch, *Solid State Technology*, pp. 44–48 (Sep. 1995).

Sakui, K. et al., "Sub-halfmicron flash memory technologies," *IEICE Trans. Electron.*, vol. E77-C, No. 8., pp. 1251–1259 (Aug., 1994).

Haken, R.A., et al., "BiCMOS Process Technology," Chapter 3, *BiCMOS Technology and Applications*, pp. 63–123.

*Primary Examiner*—Chandra Chaudhari
*Attorney, Agent, or Firm*—Limbach & Limbach L.L.P.

[57] ABSTRACT

The overetching that occurs during the formation of contact openings in a substantially planarized layer of insulation material is substantially reduced by changing the thickness of the insulation material that is formed over the top conductive structure of a semiconductor device, and by forming the openings to the top conductive structure during the fabrication of a second metal layer rather than during the formation of a first metal layer.

19 Claims, 6 Drawing Sheets

５,607,873

METHOD FOR FORMING CONTACT OPENINGS IN A MULTI-LAYER STRUCTURE THAT REDUCES OVERETCHING OF THE TOP CONDUCTIVE STRUCTURE

BACKGROUND OF THE INVENTION

1. Field of the Invention

The present invention relates to a method for forming the contact openings in a multi-layer structure and, more particularly, to a method that reduces overetching of the top conductive structure during the formation of the contact openings.

2. Description of the Related Art

Prior to the formation of a first metal layer, conventional semiconductor devices are covered with a layer of insulation material that is formed to have a more planarized top surface than the underlying topography of the semiconductor device. The overlying layer of insulation material, in turn, isolates the semiconductor device from the outside world and provides the support structure needed for the to-be-formed metal lines.

FIG. 1 shows a cross-sectional diagram that illustrates a portion of a conventional semiconductor device 30. As shown in FIG. 1, semiconductor device is formed on a substrate 20 that includes a 30 conductive region 22 such as a source or drain region.

The semiconductor device 30, in turn, is covered with a layer of insulation material 40, and has a plurality of layers that include a poly-2 layer 32, a poly-1 layer 34, and an interpoly dielectric layer 36, such as ONO, formed between the poly-1 and poly-2 layers 32 and 34. In addition, poly-2 layer 32, poly-1 layer 34, and conductive region 22 are electrically connected to metal lines M1, M2, and M3 by contacts C1, C2, and C3, respectively.

As further shown in FIG. 1, the underlying topography of semiconductor device 30, which is defined on the top by poly-2 layer 32, in the middle by poly-1 layer 34, and at the bottom by conductive region 22, has a substantial variation in height.

On the other hand, the topography of the top surface of the layer of insulation material 40, while not being substantially planar, smoothes out the changes in height from the poly-2 layer 32 to the poly-1 layer 34, and from the poly-1 layer 34 to the surface of substrate 20. Any one of several well-known processes, which include the use of spin-on-glass (SOG), reflow, and resist etchback, can be used to form the more planarized top surface of the layer of insulation material 40.

One significant advantage that results from the surface of the layer of insulation material 40 not being substantially planarized is that the depths of contacts C1, C2, and C3 are roughly similar. As a result, neither poly-2 layer 32, poly-1 layer 34, nor substrate 20 is subject to severe overetching during the formation of the contact openings.

More recently, however, as a result of shrinking design rules (0.35 micron technology) and the use of more metal interconnect layers, the above-noted techniques that have been conventionally utilized to form the layer of insulation material are giving way to a planarization technique known as chemical mechanical polishing (CMP). With CMP, a layer of insulation material is formed over the semiconductor device, and then polished down to a fully planar surface.

FIG. 2 shows a cross-sectional drawing that illustrates the semiconductor device 30 of FIG. 1 with a chemically mechanically polished insulation layer 50. As shown in FIG. 2, one major problem caused by CMP techniques is that the depths of contacts C1, C2, and C3 are no longer roughly similar, but are instead significantly different.

As a result, when the layer of insulation material 50 is etched to form the contact openings C1, C2, and C3, the insulation layer 50 and the poly-2 layer 32 are severely overetched by the time a contact opening is made to the conductive region 22 of substrate 20. Overetching of the insulation layer 50 varies the diameters of the contact openings, while overetching of the poly-2 layer 32 varies the electrical characteristics of the device.

One technique for limiting the overetching is to use two contact masks; one mask for the shallow contacts and one mask for the deep contacts. Although this technique reduces the problem of overetching, it requires an additional masking step that increases the cost and complexity of the process.

Another technique that can be utilized to limit the overetching is to form a portion of the poly-2 layer 32 on the same level as the poly-1 layer 34. FIG. 3 shows a cross-sectional drawing that illustrates the semiconductor device 30 of FIG. 1 with a portion of the poly-2 layer 32 formed at the same level as poly-1 layer 34.

As shown in FIG. 3, by forming a portion of the poly-2 layer on the same level, the etching time required to expose both the poly-2 and poly-1 layers 32 and 34 is approximately the same. As a result, the poly-2 and poly-1 layers 32 and 34 will only be slightly overetched during the additional etch time required to expose the conductive substrate region (not shown in FIG. 3). The drawback to this approach, however, is that by forming the poly-2 layer 32 on the same level as the poly-1 layer 34, the size of the die must often be increased to accommodate the larger size of the poly-2 layer.

Thus, there is a need for a method that can form contact openings in a planarized layer of insulation material without overetching the layer of insulation material or the underlying conductive structures, requiring additional masking steps, or increasing the die size.

SUMMARY OF THE INVENTION

The present invention provides a method for forming contact openings that reduces the overetching that occurs to the structures exposed by the contact openings when the depth of the openings is substantially different.

The process of the present invention operates on a multi-layer structure that includes a semiconductor structure formed on a semiconductor substrate, and a first layer of insulation material formed on the semiconductor structure. The semiconductor substrate has a conductive region, such as a source or drain region, while the semiconductor structure has a plurality of conductive structures that includes a top conductive structure and an intermediate conductive structure.

The method of the present invention begins by planarizing the top surface of the first layer of insulation material, such as with chemical mechanical polishing, until the top surface of the first layer of insulation material is substantially planarized. Following this, a plurality of contact openings are formed in the first layer of insulation material so that a first contact opening exposes a portion of the intermediate conductive structure, and a second contact opening exposes a portion of the conductive region. Next, a plurality of metal-1 lines are formed over the first layer of insulation material so that a first metal-1 line fills the first contact opening and electrically contacts the intermediate conductive structure, and a second metal-1 line fills the second contact opening and electrically contacts the conductive region. After the metal-1 lines have been formed, a second layer of insulation material is formed over the first layer of insulation material and the metal-1 lines so that the second layer of insulation material has a substantially planar top surface. Following this, a plurality of via openings are formed in the second layer of insulation material so that a first via opening exposes the first metal-1 line, and a second via opening exposes the second metal-1 line. In accordance with the present invention, a via opening is also formed in the second layer of insulation material and any underlying first layer of insulation material so that a third via opening exposes a portion of the top conductive structure. Once the via openings have been formed, a plurality of metal-2 lines are formed over the second layer of insulation material so that a first metal-2 line fills the first via opening and electrically contacts the first metal-1 line, a second metal-2 line fills the second via opening and electrically contacts the second metal-1 line, and a third metal-2 line fills the third via opening and electrically contacts the top conductive structure.

A better understanding of the features and advantages of the present invention will be obtained by reference to the following detailed description and accompanying drawings which set forth an illustrative embodiment in which the principals of the invention are utilized.

DETAILED DESCRIPTION

FIGS. 4A–4G show cross-sectional diagrams that illustrate a process for forming contact openings in accordance with the present invention. As described in greater detail below, the present process substantially reduces the overetching that occurs during the formation of contact openings by changing the thickness of the insulation material formed over the top conductive layer of a semiconductor structure, and by forming the contact openings to the top conductive layer during the fabrication of a second metal layer rather than during the fabrication of a first metal layer.

Figure 1:
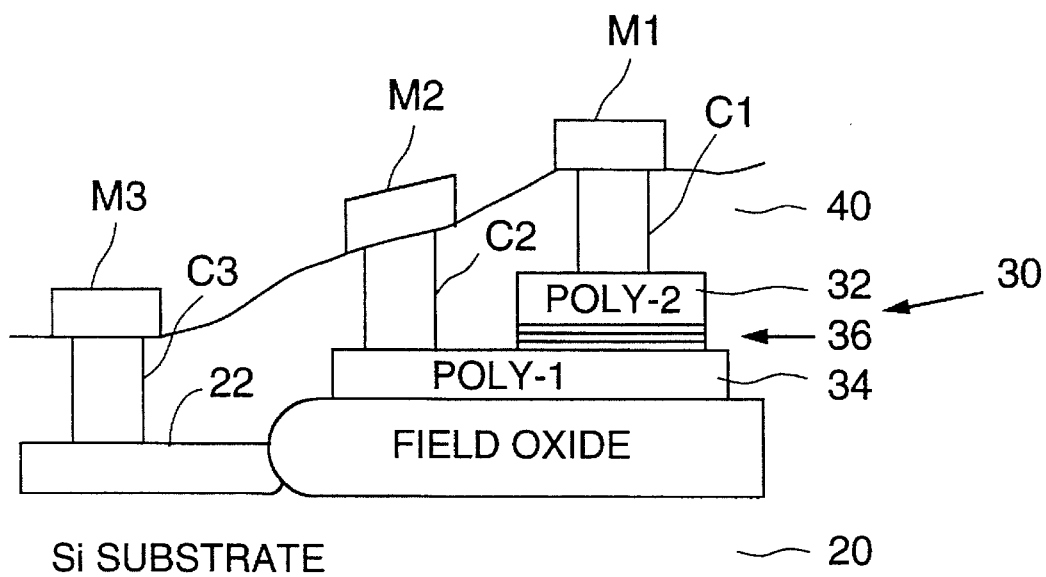
FIG. 1 is a cross-sectional diagram illustrating a portion of a conventional semiconductor structure 30.
Figure 2:
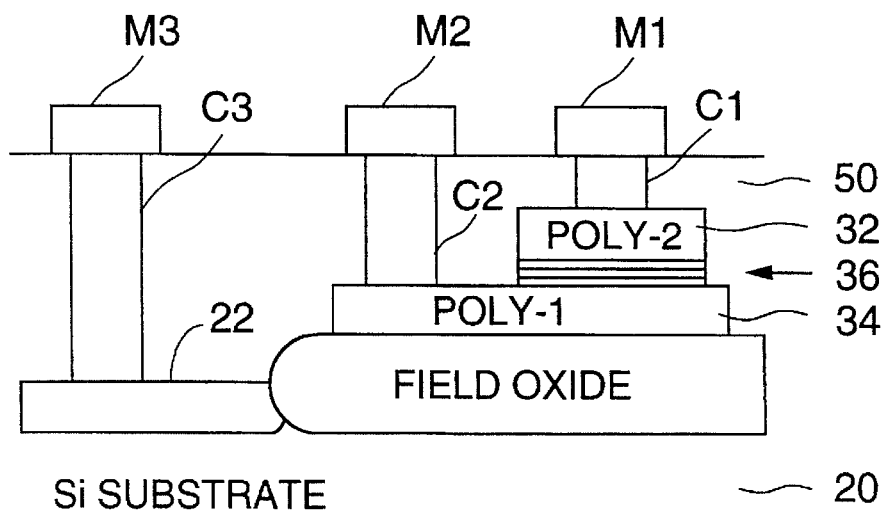
FIG. 2 is a cross-sectional drawing illustrating the semiconductor device 30 of FIG. 1 with a chemically mechanically polished insulation layer 50.
Figure 3:
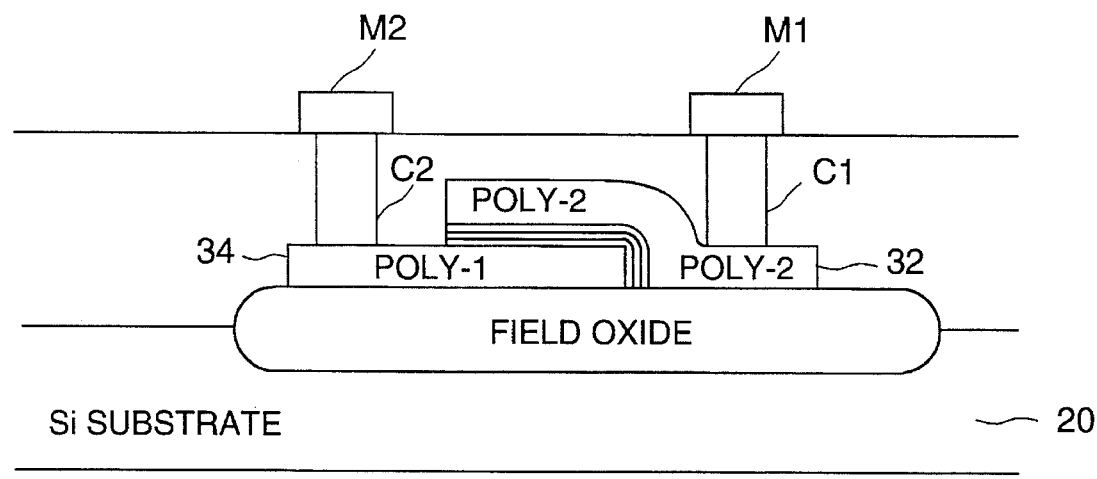
FIG. 3 is a cross-sectional drawing illustrating a portion of the poly-2 layer 32 formed at the same level as poly-1 layer 34.
Figure 4A:
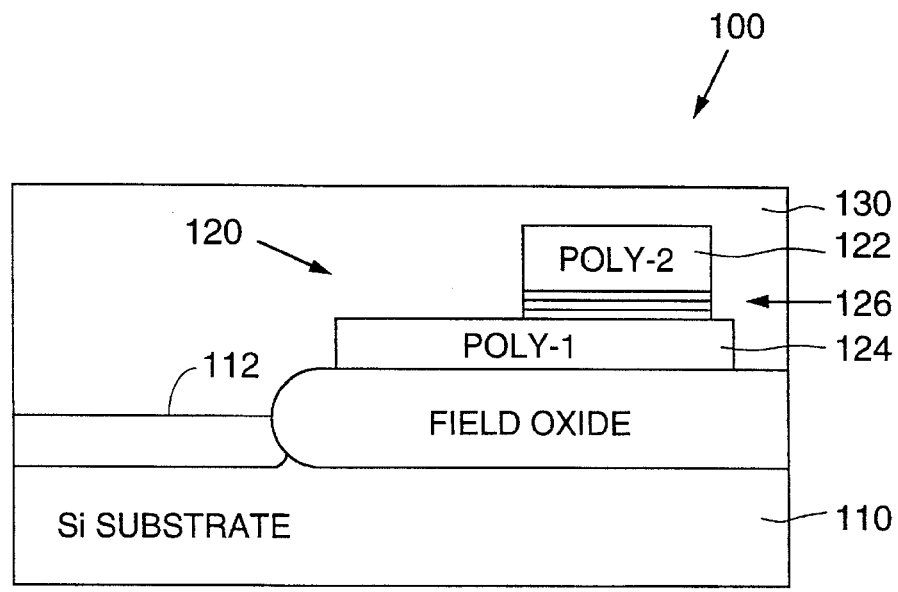
FIGS. 4A–4G are cross-sectional diagrams illustrating a process for forming contact openings in accordance with the present invention.

As shown in FIG. 4A, the process of the present invention operates on a multi-layer structure 100 that includes a semiconductor structure 120 formed on a semiconductor substrate 110, and a first layer of insulation material 130 formed on the semiconductor structure 120. The first layer of insulation material 130 can be formed from oxide, glass, or other common insulation materials.

As further shown in FIG. 4A, semiconductor substrate 110 includes conductive regions 112, such as source and drain regions, which are formed along the surface of substrate 110.

The semiconductor structure 120, in turn, has a plurality of conductive structures that include a top conductive structure 122 and an intermediate conductive structure 124. The top and intermediate conductive structures 122 and 124 can be formed from, for example, a layer of doped polysilicon, or a layer of doped polysilicon with an overlying conductive layer, such as tungsten or tungsten silicide. In addition, the top conductive structure 122 and the intermediate conductive structure 124 are separated by a layer of dielectric material 126, such as oxide-nitride-oxide (ONO).

The top conductive structure 122 represents one or more structures which are located a substantially similar distance from the top surface of substrate 110, and the farthest from the top surface of substrate 110. Thus, for example, the top conductive structure 122 can include both the word lines of a memory array and the top plates of interpoly capacitors if both of these structures are located a substantially similar distance from the top surface of substrate 110.

The intermediate conductive structure 124, on the other hand, represents one or more structures which are located a substantially similar distance from the top surface of the substrate 110, and the next farthest from the top surface of substrate 110 after the top conductive structure 122. Thus, for example, the intermediate conductive structure 124 can include the gates of conventional MOS transistors and the lower plates of interpoly capacitors if these structures are located a substantially similar distance from the top surface of substrate 110.

Turning now to FIG. 4A, the process of the present invention begins by planarizing the top surface of the first layer of insulation material 130, such as with chemical mechanical polishing, until the top surface is substantially planarized, and the thickness of the first layer of insulation material 130 over the top conductive structure 122 is approximately equal to a predetermined thickness. The top surface is substantially planarized when the top surface has only minor deviations from being fully planarized.

In the present invention, the first layer of insulation material 130 can be completely removed from the top surface of the top conductive structure 122. Alternately, however, one may wish to leave a few tens, to a few hundreds, to a few thousands, to a few tens of thousands of angstroms of the first layer of insulation material 130 over the top conductive structure 122 to protect the top conductive structure 122 from subsequent processing steps. As a result, the predetermined thickness can range from zero to a few tens of thousands of angstroms of material. (As described in greater detail below, the thickness of the first layer of insulation material 130 left over the top conductive structure 122 varies the relative etch ratio).

Figure 4B:
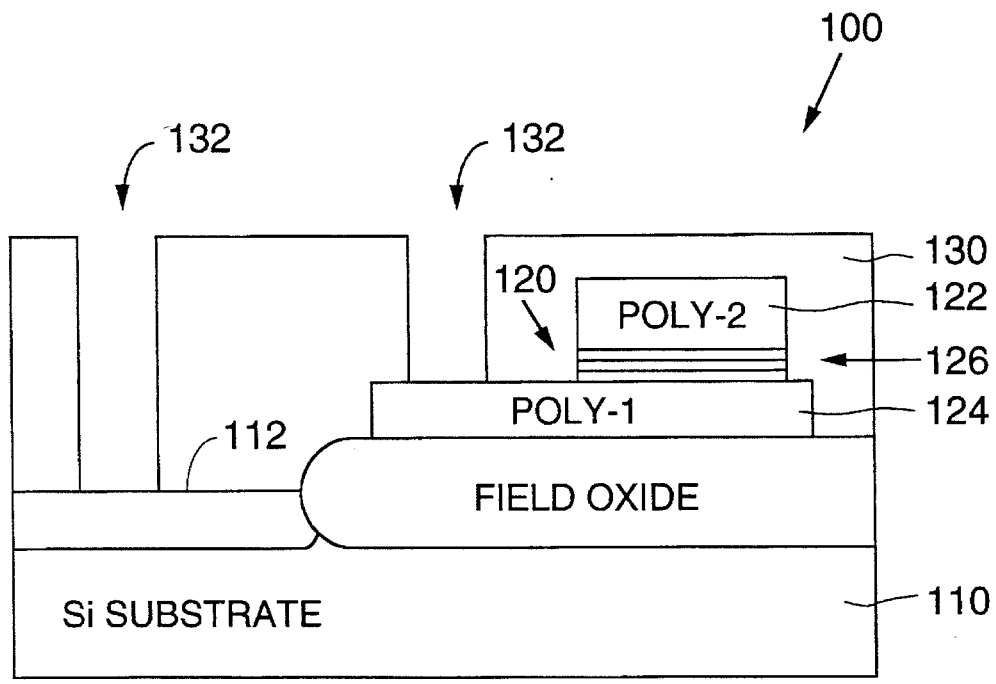

Referring to FIG. 4B, following the planarization of the first layer of insulation material 130, a contact mask (not shown) is formed and patterned on the first layer of insulation material 130 to define a series of insulation openings 132. Next, the unmasked areas of the first layer of insulation material 130 are etched until the intermediate conductive structure 124, any other conductive structures closer to substrate 110, and selected conductive regions 112 of substrate 110 are exposed. The conductive regions 112 that are exposed depends on the device formed by semiconductor structure 120. After the etch has been completed, the contact mask is then stripped.

Figure 4C:
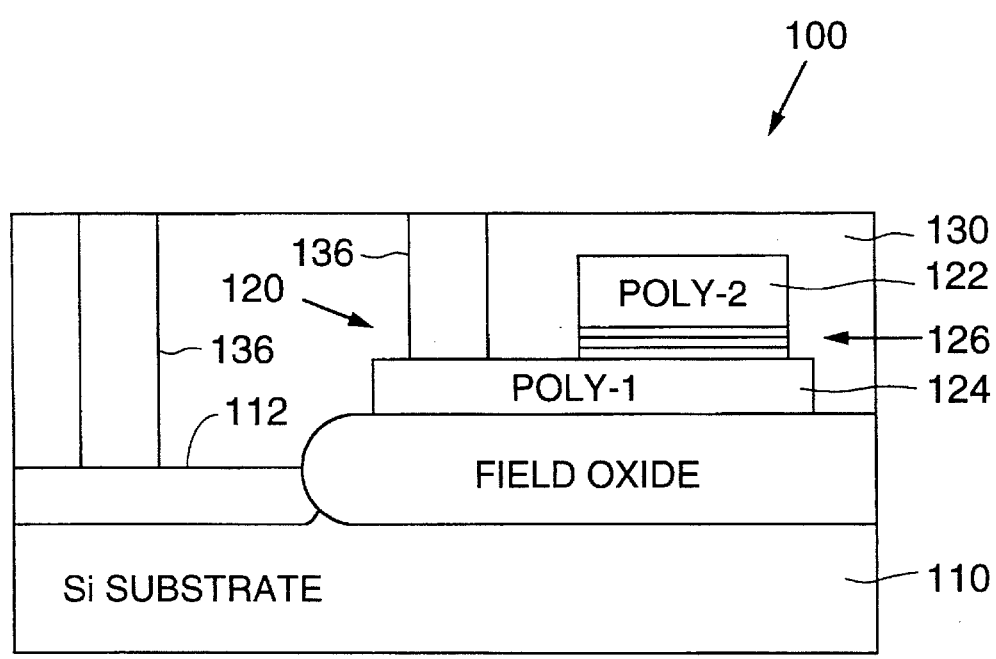

Referring to FIG. 4C, once the contact mask has been stripped, a first layer of plug material (not shown), such as tungsten, is deposited over the entire structure. Due to the highly conformal nature of tungsten, the layer of tungsten flows into and fills up each of the insulation openings 132 so that the tungsten contacts the intermediate conductive structure 124, any other conductive structures closer to substrate 110, and the selected conductive regions 112 of substrate 110 which were exposed during the contact etch step.

Next, the layer of tungsten is uniformly etched until the layer of tungsten is removed from the top surface of the first layer of insulation material 130. As a result, a metal contact plug 136 is formed in each of the insulation openings 132.

Figure 4D:
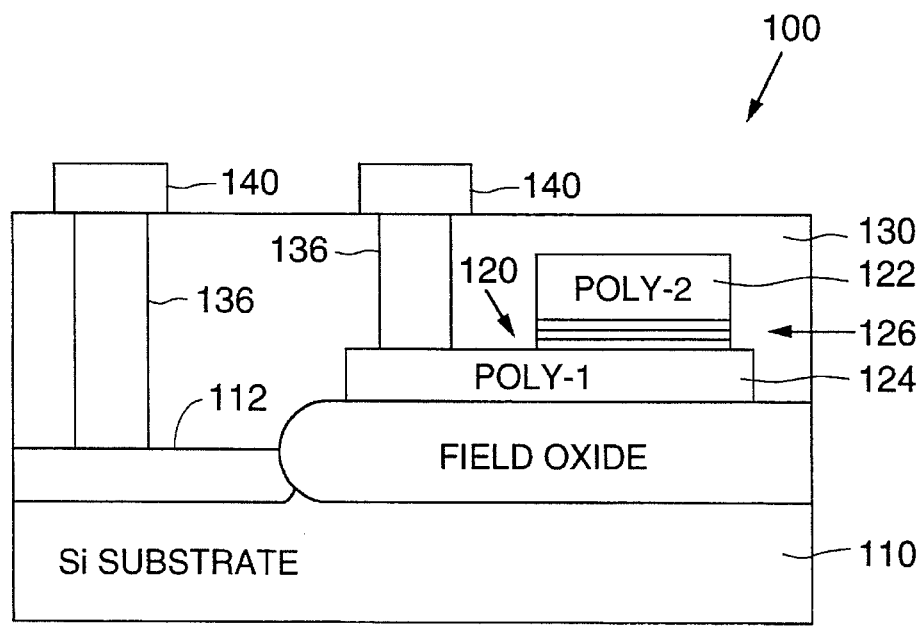

Referring to FIG. 4D, once the metal contact plugs 136 have been formed, a layer of first metal (metal-1) (not shown), such as aluminum, is deposited over the entire structure. Next, a first metal line mask (not shown) is formed and patterned to define a series of metal-1 lines 140 which contact one or more of the metal contact plugs 136. Following this, the unmasked areas of the layer of metal-1 are etched until the unwanted layer of metal-1 is removed. The first metal line mask is then stripped.

Alternately, the layer of metal-1 can be utilized to directly contact the intermediate conductive structure 124, any other layers and structures, and the selected conductive regions 112, thereby eliminating the steps required to form the tungsten plugs 136.

Figure 4E:
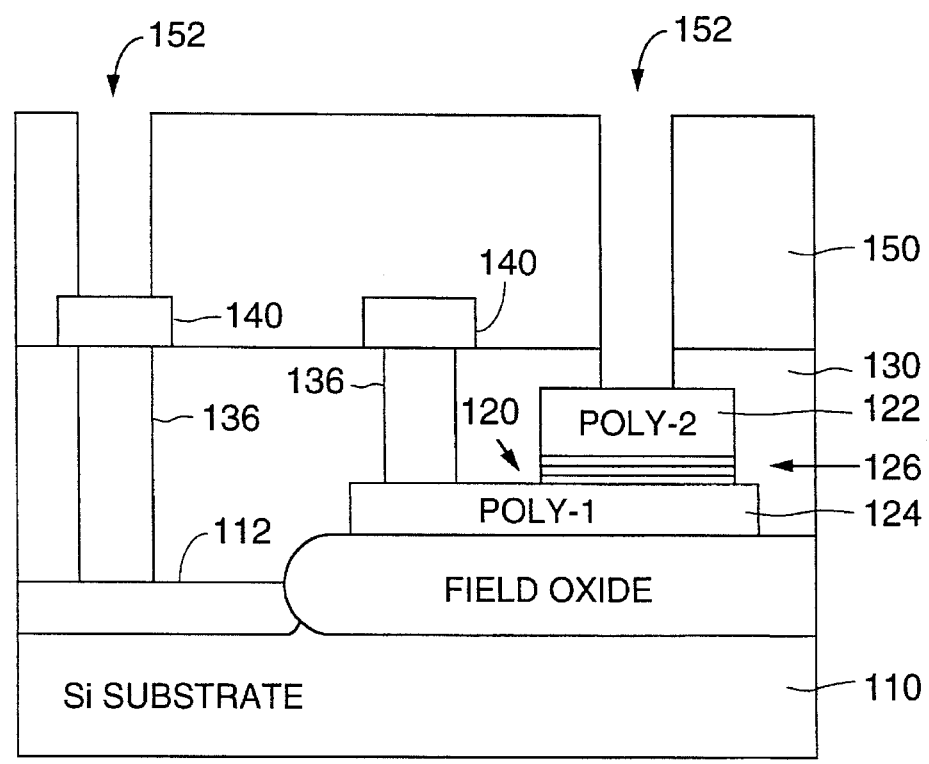

Referring to FIG. 4E, after the metal-1 lines 140 have been formed, a second layer of insulation material 150, such as oxide or glass, is deposited over the first layer of insulation material 130 and the metal-1 lines 140. Following this, the top surface of the second layer of insulation material 150 is planarized, such as with chemical mechanical polishing, until the second layer of insulation material 150 has a substantially planar top surface.

Alternately, since the top surface of the first layer of insulation material 130 was substantially planarized, the top surface of the second layer of insulation material 150 may also be substantially planarized using spin-on-glass (SOG), reflow, resist etchback, or other common planarization techniques.

As is well known, SOG is a dielectric material that is applied in liquid form, reflow is a technique whereby an insulation material is heated to a liquid or semi-liquid form, and resist etchback is a technique whereby an insulation material is covered with resist, which is in liquid form, and then etched until the resist has been removed.

Following the formation of the second layer of insulation material 150, a via contact mask (not shown) is formed and patterned on the second layer of insulation material 150 to define a series of via contact openings 152. Next, the unmasked areas of the second layer of insulation material 150 and any remaining thickness of the first layer of insulation material 130 are etched until the top conductive structure 122 and selected metal-1 lines 140 are exposed. After the etch has been completed, the via contact mask is then stripped.

Figure 4F:
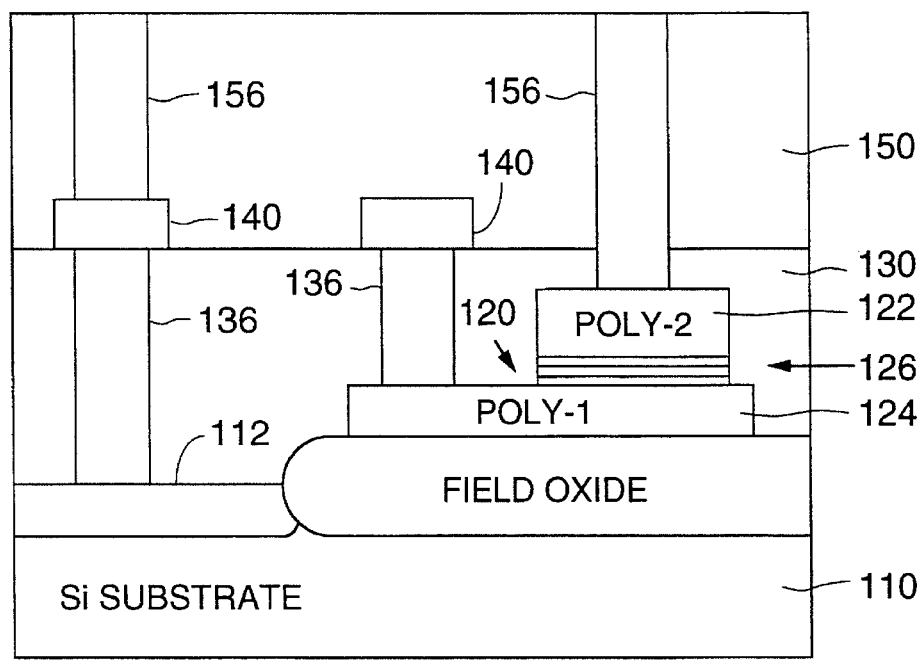

Referring to FIG. 4F, once the via contact mask has been stripped, a second layer of plug material, such as tungsten, is deposited over the entire structure. Due to the highly conformal nature of tungsten, the layer of tungsten flows into and fills up each of the via contact openings 152 so that the tungsten contacts the top conductive structure 122 and the selected metal-1 lines 140 which were exposed during the via contact etch step. Next, the layer of tungsten is uniformly etched until the layer of tungsten is removed from the top surface of the second layer of insulation material 150. As a result, a via plug 156 is formed in each of the via contact openings.

Figure 4G:
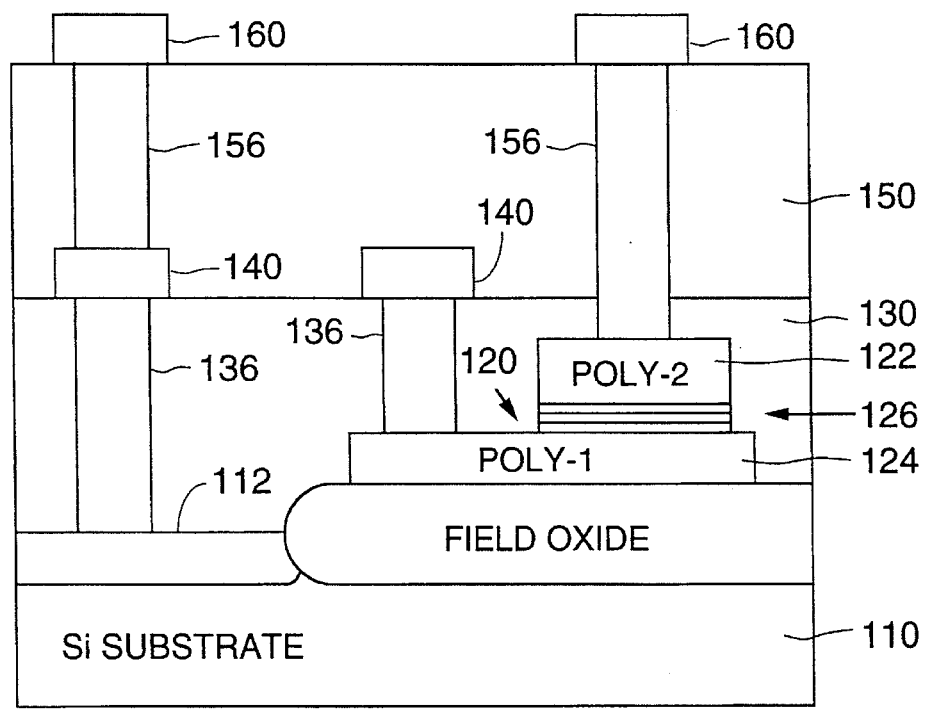

Referring to FIG. 4G, after the via plugs 156 have been formed, a layer of second metal (metal-2) (not shown), such as aluminum, is deposited over the entire structure. Next, a second metal line mask (not shown) is formed and patterned to define a series of metal-2 lines 160 which contact one or more of the via plugs 156. Following this, the unmasked areas of the layer of metal-2 are etched until the unwanted layer of metal-2 is removed. The second metal line mask is then stripped.

Alternately, as above, the layer of metal-2 can be utilized to directly contact the top conductive layer 122 and the selected metal-1 lines 140, thereby eliminating the steps required to form the tungsten plugs 156.

Figure 5A:
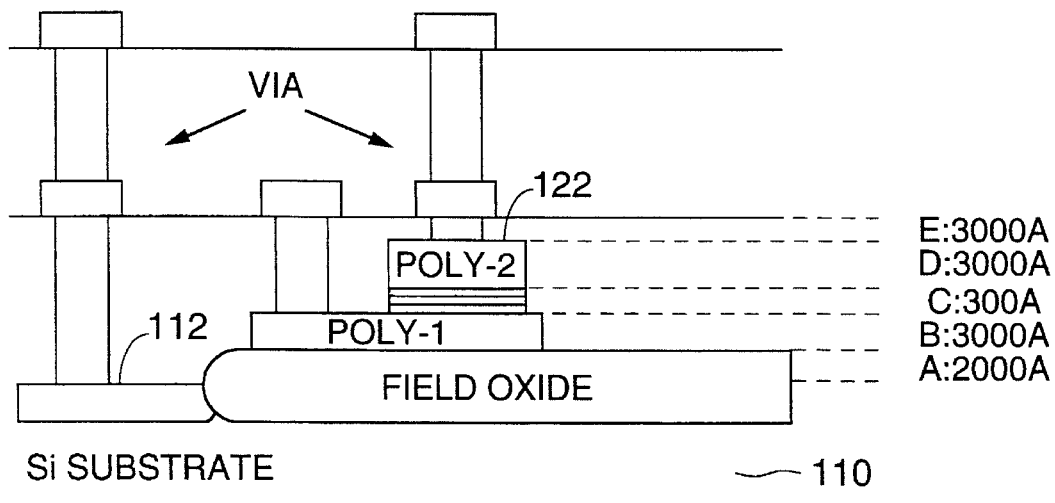
FIGS. 5A–5B are cross-sectional diagrams illustrating the advantages of forming contact openings in accordance with the present invention.
Figure 5B:
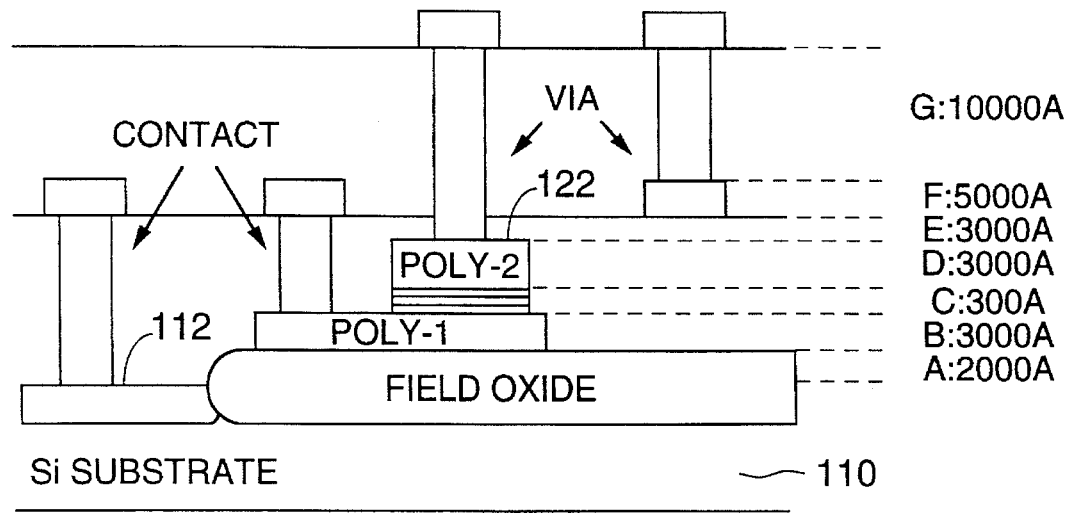

FIGS. 5A–5B show cross-sectional diagrams that illustrate the advantages of forming contact openings in accordance with the present invention. As shown in FIGS. 5A and 5B, the approximate thickness of each layer of a multi-layer structure is listed next to each layer, and is summarized below in Tables 1 and 2, respectively.

As shown in FIG. 5A and Table 1, when a contact opening to the top conductive structure 122 is formed at the same time as the contact opening to substrate 110, as is conventionally the case, 3,000 Å of the first layer of insulation material 130 must be etched through to reach the top conductive structure 122, whereas 11,300 Å of the first layer of insulation material 130 must be etched

TABLE 1

| Layer | Deep Contact | Shallow Contact |
|---|---|---|
| E | 3,000Å | 3,000Å |
| D | 3,000Å | |
| C* | 300Å | |
| B | 3,000Å | |
| A | 2,000Å | |
| Totals | 11,300Å | 3,000Å |

*Interpoly dielectric 126
Ratio: 11,300/3,000 = 3.77 through to reach the conductive regions 112 of substrate 110. Thus, the conventional formation of the contact openings produces an etch ratio of 3.77:1.

In the present invention, however, since the contact opening to the top conductive structure 122 is formed during a subsequent step, only contact openings to the intermediate conductive structure 124, any closer structures, and the conductive regions 112 of substrate 110 are formed at the same time.

As a result, although 11,300 Å of the first layer of insulation material 130 must still be etched through to reach the conductive regions 112 of substrate 110, 6,300 Å of the first layer of insulation material 130 must now be etched through to reach the intermediate conductive structure 124. This, in turn, substantially reduces the etch ratio from 3.77:1 to 1.79:1 in the present invention.

TABLE 2

| Layer | Deep Contact | Shallow Contact | Deep Via | Shallow Via |
|---|---|---|---|---|
| G | | | 10,000Å | 10,000Å |
| F | | | 5,000Å | |

TABLE 2-continued

| Layer | Deep Contact | Shallow Contact | Deep Via | Shallow Via |
|---|---|---|---|---|
| E | 3,000Å | 3,000Å | 3,000Å | |
| D | 3,000Å | 3,000Å | | |
| C | 300Å** | 300Å | | |
| B | 3,000Å | | | |
| A | 3,000Å | | | |
| Totals | 11,300Å | 6,300Å | 18,000Å | 10,000Å |

**Interpoly dielectric 126
Ratio: 11,300/6,300 = 1.79   18,000/10,000 = 1.80

In addition, FIG. 5B and Table 2 also show that, although the etch ratio for forming the vias is now less than optimum (a change from 1:1 to 1.8:1), the amount of overetching during the formation of the vias is modest, particularly in view of the substantial reduction in the etch ratio of the contact openings.

Thus, in accordance with the present invention, a method has been described for forming contact openings in a multi-layer semiconductor structure that substantially reduces the overetching that occurs during the formation of the contact openings by selecting the number of structures that are exposed prior to the formation of the first metal layer, and the number of structures that are exposed prior to the formation of the second metal layer in view of which grouping provides the best etch ratio.

It should be understood that various alternatives to the embodiment of the invention described herein may be employed in practicing the invention. Therefore, it is intended that the following claims define the scope of the invention and that methods and structures within the scope of these claims and their equivalents be covered thereby.

What is claimed is:

1. A method for forming contact openings in a multi-layer structure that includes a semiconductor structure formed on a semiconductor substrate, and a first layer of insulation material formed on the semiconductor structure, the semiconductor substrate having a conductive region, the semiconductor structure having a plurality of conductive structures that includes a top conductive structure and an intermediate conductive structure, the method comprising the steps of:

planarizing the top surface of the first layer of insulation material until the top surface of the first layer of insulation material is substantially planarized;

forming a plurality of contact openings in the first layer of insulation material after the top surface of the first layer of insulation material has been substantially planarized so that a first contact opening exposes a portion of the intermediate conductive structure, and so that a second contact opening exposes a portion of the conductive region;

forming a plurality of metal-1 lines over the first layer of insulation material so that a first metal-1 line fills the first contact opening and electrically contacts the intermediate conductive structure, and so that a second metal-1 line fills the second contact opening and electrically contacts the conductive region;

forming a second layer of insulation material over the first layer of insulation material and the metal-1 lines so that the second layer of insulation material has a substantially planar top surface;

forming a plurality of via openings in the second layer of insulation material so that a first via opening exposes the first metal-1 line, and a second via opening exposes the second metal-1 line, and forming a via opening in the second layer of insulation material and any underlying first layer of insulation material so that a third via opening exposes a portion of the top conductive structure; and forming a plurality of metal-2 lines over the second layer of insulation material so that a first metal-2 line fills the first via opening and electrically contacts the first metal-1 line, a second metal-2 line fills the second via opening and electrically contacts the second metal-1 line, and so that a third metal-2 line fills the third via opening and electrically contacts the top conductive structure.

2. The method of claim 1 wherein the step of forming a plurality of metal-1 lines includes the steps of:

forming a plurality of contact plugs in the contact openings so that a first contact plug fills the first contact opening and electrically contacts the intermediate conductive structure, and a second contact plug fills the second contact opening and electrically contacts the conductive region; and forming the plurality of metal-1 lines over the first layer of insulation material so that the first metal-1 line electrically contacts the first contact plug, and the second metal-1 line electrically contacts the second contact plug.

3. The method of claim 1 wherein the step of forming a plurality of metal-2 lines includes the steps of:

forming a plurality of via plugs in the via openings so that a first via plug fills the first via opening and electrically contacts the first metal-1 line, a second via plug fills the second via opening and electrically contacts the second metal-1 line, and a third via plug fills the third via opening and electrically contacts the top conductive layer; and forming the plurality of metal-2 lines over the second layer of insulation material so that the first metal-2 line electrically contacts the first metal-1 line, a second metal-2 line electrically contacts the second metal-1 line, and a third metal-2 line electrically contacts the third via plug.

4. The method of claim 1 wherein the planarizing step continues until a thickness of the first layer of insulation material over the top conductive structure is approximately equal to a predetermined thickness.

5. The method of claim 4 wherein the predetermined thickness includes a thickness of zero.

6. The method of claim 1 wherein the step of forming a second layer of insulation material includes the step of chemically mechanically polishing the top surface of the second layer of insulation material.

7. The method of claim 1 wherein the step of forming a second layer of insulation material includes the step of applying spin-on-glass.

8. The method of claim 1 wherein the step of forming a second layer of insulation material includes the steps of:

depositing the layer of second insulation material; and heating the layer of second insulation material to reflow the layer of second insulation material.

9. The method of claim 1 wherein the step of forming a second layer of insulation material includes the steps of:

depositing the layer of second insulation material;

forming a layer of resist over the layer of second insulation material; and etching the layer of resist and the underlying layer of second insulation material until the layer of resist has been removed.

10. The method of claim 1 wherein the top conductive structure includes a word line.

11. The method of claim 1 wherein the top conductive structure includes the top plate of an interpoly capacitor.

12. The method of claim 1 wherein the intermediate conductive structure includes a MOS gate.

13. The method of claim 1 wherein the conductive region includes a drain region.

14. The method of claim 1 wherein the conductive region includes a source region.

15. The method of claim 1 wherein the top conductive structure includes one or more structures which are located an approximately equal distance from the substrate.

16. The method of claim 1 wherein the intermediate conductive structure includes one or more structures which are located an approximately equal distance from the substrate.

17. The method of claim 1 wherein the first layer of insulation material includes oxide.

18. The method of claim 1 wherein the second layer of insulation material includes oxide.

19. The method of claim 1 wherein the planarizing step includes chemically mechanically polishing the top surface of the first layer of insulation material.

* * * * *